(12) United States Patent
Brcka

(10) Patent No.: US 10,672,596 B2
(45) Date of Patent: Jun. 2, 2020

(54) IONIZED PHYSICAL VAPOR DEPOSITION (IPVD) APPARATUS AND METHOD FOR AN INDUCTIVELY COUPLED PLASMA SWEEPING SOURCE

(71) Applicant: Tokyo Electron Limited, Minato-ku, Tokyo (JP)

(72) Inventor: Jozef Brcka, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/447,875

(22) Filed: Mar. 2, 2017

(65) Prior Publication Data
US 2017/0278686 A1   Sep. 28, 2017

Related U.S. Application Data

(60) Provisional application No. 62/313,940, filed on Mar. 28, 2016.

(51) Int. Cl.
*H01J 37/34* (2006.01)
*C23C 14/34* (2006.01)
(Continued)

(52) U.S. Cl.
CPC ........ *H01J 37/3476* (2013.01); *C23C 14/046* (2013.01); *C23C 14/345* (2013.01); *C23C 14/3464* (2013.01); *C23C 14/358* (2013.01); *H01J 37/3211* (2013.01); *H01J 37/32137* (2013.01); *H01J 37/32183* (2013.01); *H01J 37/3402* (2013.01); *H01J 37/3429* (2013.01)

(58) Field of Classification Search
CPC ..... C23C 14/046; C23C 14/32; C23C 14/345; C23C 14/3464; C23C 14/35; C23C 14/358; H01J 37/3211; H01J 37/32137; H01J 37/32183; H01J 37/3402; H01J 37/3429; H01J 37/3476; H01L 21/2855

USPC ............ 204/192.12, 298.16–298.19, 192.13, 204/298.03

See application file for complete search history.

(56) References Cited

U.S. PATENT DOCUMENTS 6,273,022 B1 * 8/2001 Pu .......................... H01J 37/321
                                                          118/723 I
6,432,286 B1 * 8/2002 Glocker .............. C23C 14/3407
                                                          204/298.08

(Continued)

FOREIGN PATENT DOCUMENTS

| JP | 01-116068 | * | 5/1989 |
| JP | 02-306522 | * | 12/1990 |
| JP | 11-310875 | * | 11/1999 |

*Primary Examiner* — Rodney G McDonald
(74) *Attorney, Agent, or Firm* — Rothwell, Figg, Ernst & Manbeck, P.C.

(57) ABSTRACT

Embodiments of methods and systems for an inductively coupled plasma sweeping source for an IPVD system. In an embodiment, a method includes providing a large size substrate in a processing chamber. The method may also include generating from a metal source a sputtered metal onto the substrate. Additionally, the method may include creating a high density plasma from a high density plasma source and applying the high density plasma in a sweeping operation without involving moving parts. The method may also include controlling a plurality of operating variables in order to meet one or more plasma processing objectives.

28 Claims, 17 Drawing Sheets

(51) Int. Cl.
  *H01J 37/32* (2006.01)
  *C23C 14/04* (2006.01)
  *C23C 14/35* (2006.01)

(56) References Cited

U.S. PATENT DOCUMENTS

| | | | | |
|---|---|---|---|---|
| 6,495,963 | B1 * | 12/2002 | Bennett | H01J 37/321 |
| | | | | 118/723 E |
| 9,279,179 | B2 * | 3/2016 | Tsai | H01J 37/3211 |
| 2004/0163944 | A1 * | 8/2004 | Oshmyansky | C23C 14/352 |
| | | | | 204/192.12 |
| 2009/0242385 | A1 * | 10/2009 | Robison | C23C 14/0641 |
| | | | | 204/192.11 |
| 2011/0147206 | A1 * | 6/2011 | Okimoto | C23C 14/3464 |
| | | | | 204/298.08 |

* cited by examiner

IONIZED PHYSICAL VAPOR DEPOSITION (IPVD) APPARATUS AND METHOD FOR AN INDUCTIVELY COUPLED PLASMA SWEEPING SOURCE

CROSS-REFERENCE TO RELATED APPLICATIONS

This application is related by subject-matter and claims priority to U.S. Provisional Application No. 62/313,940, entitled, "Poly-phased Inductively Coupled Plasma Source," filed Mar. 28, 2016, the entire contents of which are herein incorporated by reference.

BACKGROUND OF THE INVENTION

Field of Invention

The present invention relates to systems and methods for substrate processing, and more particularly to an Ionized Physical Vapor Deposition (IPVD) apparatus and method for an inductively coupled plasma sweeping source.

Description of Related Art

Scaling is a primary concern in semiconductor processing, both at the device level, and at the wafer level. At the device level, there is a constant drive to reduce the size or physical dimensions of features formed on or in the surface of the wafer. At the wafer level, on the other hand, there is a constant drive to increase the overall wafer size, so that more devices or features can be formed in a single set of process steps. Increased wafer size reduces overall device processing costs and efficiency.

Ideally, device consistency is improved with larger wafer size as well, but that may not always be the case, due to limitations of existing semiconductor fabrication tools. For example, a typical plasma source of an IPVD system is generally not capable of providing a sufficiently uniform plasma field when used on wafers over 300 mm in size. In particular, uniformity is a substantial problem when the wafer size approached 450 mm, especially when system requirements dictate that the source non-uniformity be below 3%, as is typically the case.

Scaling and development of 450 mm capable IPVD represents a new level of complexity. Prior hardware solutions that include geometric scaling and operation modes to meet process requirements have been found to be either insufficient or too costly to implement when scaled toward 450 mm, particularly in applications where the IPVD is used to deposit barrier and seed layers into trenches and vias that form interconnects for Integrated Circuits (ICs). Although 300 mm IPVD tools have been previously developed, the 300 mm IPVD systems utilize an Inductively Coupled Plasma (ICP) source with 3D antennas. To scale such tools into 450 mm is difficult, if not impossible, due to unknown optimal configuration and interplay of several sources inside vacuum chamber. Such systems typically include three sub-sources: a metal source, a high density plasma source, and a substrate bias source.

In contrast to the "scaling up" of the individual components for IPVD source to adjust the tool to increased wafer size, the metallization features on the wafer are "scaled down" to follow trend that is generally referred in semiconductor fabrication as "Moore's law". Unfortunately, the physics of the plasma, such as interactions between electrons and atoms, is not scaled accordingly, and plasma has to be generated and sustained such that tradeoffs of both scaling challenges are balanced. There is a challenge to generate such a large plasma field, specifically plasma consisting of metal atoms and ions, and still meet process performance at the wafer surface, which may be 20 nm to 14 nm per node. At this metalization scale the critical dimensions of features for barrier and seed deposition are in the range of 32 nm to 12 nm. Another challenge is to provide system with high throughput but low cost of operation, which is still suitable for technology transition into 450 mm or more ranges at a mass fabrication level.

SUMMARY OF THE INVENTION

Embodiments of methods and systems for an inductively coupled plasma sweeping source for an IPVD system. In an embodiment, a method includes providing a large size substrate in a processing chamber. The method may also include generating from a metal source a sputtered metal onto the substrate. Additionally, the method may include creating a high density plasma from a high density plasma source and applying the high density plasma in a sweeping operation without involving moving parts. The method may also include controlling a plurality of operating variables in order to meet one or more plasma processing objectives.

A system for plasma processing may also include a metal source configured to supply a metal for ionized physical vapor deposition on a substrate in a process chamber. The system may also include a high-density plasma source configured to generate a dense plasma. The system may also include a substrate bias source configured to provide a potential necessary to thermalize and ionize the plasma, wherein the substrate is 300 mm or larger.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

FIG. 126 illustrates an embodiment of a power supply for an IPVD apparatus having an inductively coupled plasma sweeping source.

DETAILED DESCRIPTION OF EMBODIMENTS OF THE INVENTION

Figure 1:
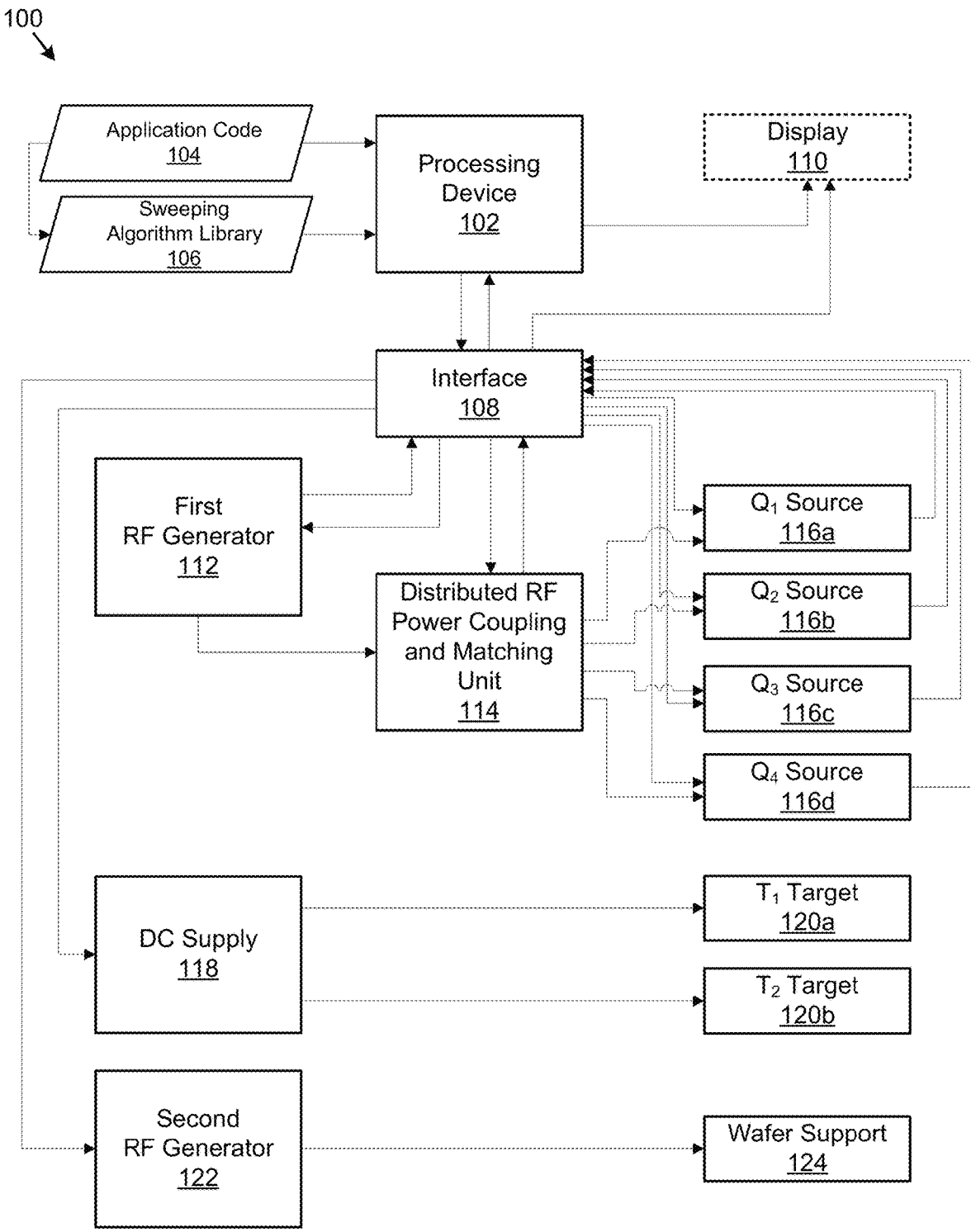
FIG. 1 illustrates one embodiment of an IPVD system having an inductively coupled plasma sweeping source.

Methods and systems for patterning sidewall shapes are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

The present embodiments are related to plasma processing tools designated for fabricating on large size silicon wafers, such as wafers having a diameter above 300 mm, and enabling industrial level manufacturing of barrier and seed layer deposition for Integrated Circuit ("IC") interconnects and metallization. The described embodiments include plasma processing systems for wafer processing of large wafers, such as 450 mm wafers, using components suitable for IPVD processes, though not limited to IPVD processes. Other plasma processing technology and substrate sizes may benefit from this disclosure.

In an embodiment, a high density plasma source may be configured for sweeping around an axis normal to the wafer surface (wafer axis "z"), allowing dual thermalization levels for metal ejected from axially symmetric targets, either at reduced or increased pressures. Such embodiments provide efficient ionization, both of slow and fast neutrals, ejected from the target. Using an azimuthal extension of a zone where metal atoms are ionized as an additional controlling factor in plasma processing allows for enhanced uniformity control. Beneficially, such embodiments may modify a shape of an ionization zone and control IPVD processes on large wafers.

Referring now to the drawings, where like reference numerals designate identical or corresponding parts throughout the several views.

FIG. 1 illustrates one embodiment of an IPVD system 100 having an inductively coupled plasma sweeping source 116a-d. In an embodiment, the system 100 includes a processing device 102, such as a computer, configured with application code 104 that is executable by the processing device for controlling the IPVD system 100. In an embodiment, the application code 104 references a sweeping algorithm library 106, and loads into the processing device 102 a sweeping algorithm suitable for a selected IPVD processing device 102 may display commands, data, and status information to a user via an optional display 110.

Additionally, the processing device 102 may communicate with other system components via the interface 108. One of ordinary skill will recognize various embodiments of an interface which may be used according to the present embodiments, including for example a Peripheral Control Interface (PCI) interface, an RS-232 interface, and RS-485 interface, or the like. Additionally, the interface 108 may connect to the processing device 102, and optionally the display device 110, for feedback of system status information from the system components.

System components may include a first Radio Frequency (RF) power generator 112, a distributed power coupling and matching unit 114, a Direct Current (DC) power supply 118, a second RF power generator 122, and the like. Additional components may include one or more plasma sources 116a-d, one or more targets 120a-b, and a wafer support 124.

In an embodiment, the processing device 102 may communicate via the interface 108 with the described components to perform operations defined by a selected sweeping algorithm. For example, the first RF generator 112 may generate RF power at a selected frequency and magnitude. The RF power may be provided to the distributed RF power coupling and matching unit 114 for control and conditioning. The distributed RF power coupling and matching unit 114 may provide the conditioned RF power to the plasma sources 116a-d, which generate a sweeping plasma field within a plasma chamber (not shown). Examples of a distributed RF power coupling and matching unit 114 are described in greater detail below with reference to FIGS. 8-15. Further embodiments of plasma sources 116a-d are described below with reference to FIGS. 3-7.

In an embodiment the DC supply 118 may be configured to provide a DC bias current charge to one or more metal targets. For example, in the embodiment of FIG. 1, the system 100 includes a first target 120a and a second target 120b. Further embodiments of the targets 120a-b are described below with reference to FIGS. 3-6. The DC bias charge may cause the targets 120a-b to attract ions in the plasma field, thereby ejecting metal atoms from the targets 120a-b into the plasma field. Metal atoms are ionized in high density plasma field.

In an embodiment, the second RF generator 122 may apply an RF bias to the wafer support 124, thereby directing metalized plasma ions onto the surface of a wafer (not shown) supported by the wafer support 124. In such an embodiment, metalized features, such as barrier and seed layers, may be deposited into trenches and vias that form interconnects for ICs.

Figure 2:
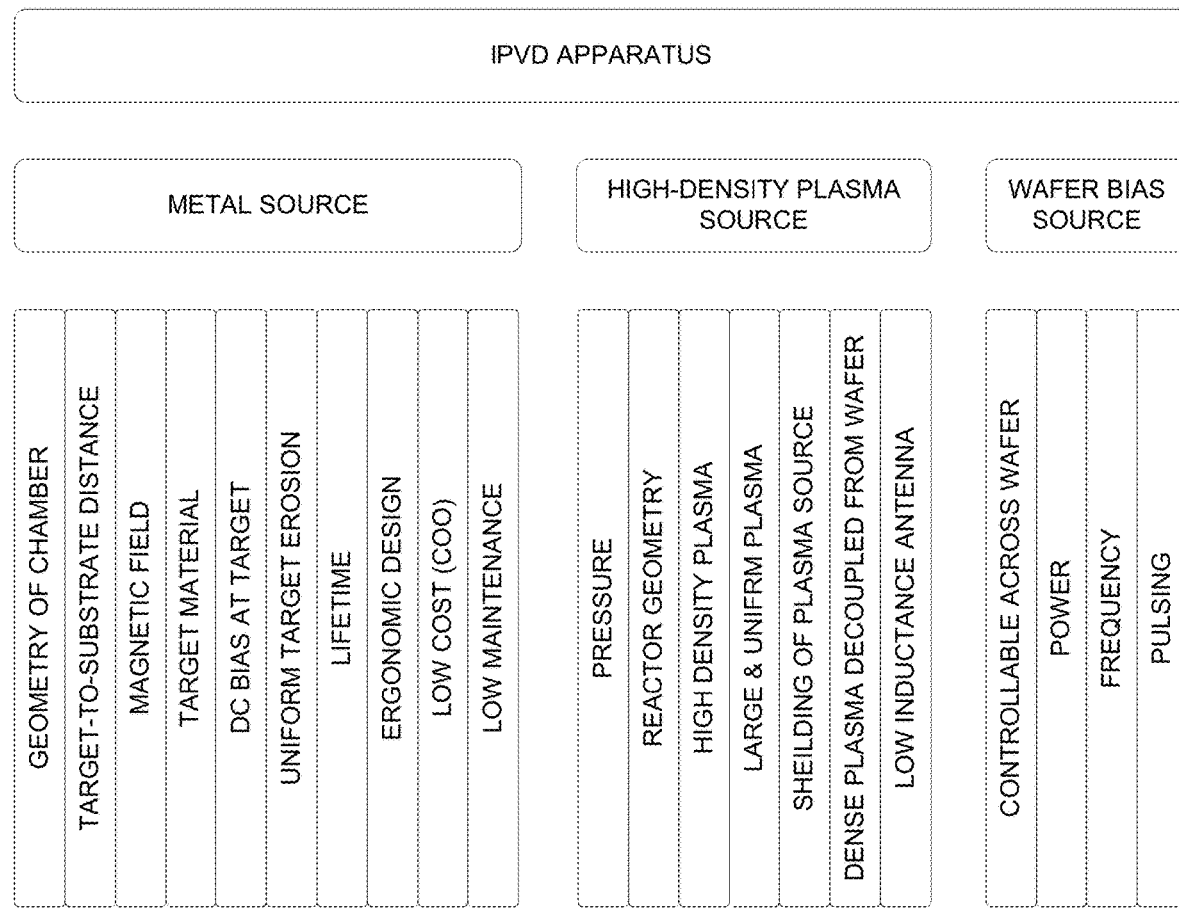
FIG. 2 illustrates one embodiment of characteristic components of an IPVD system having an inductively coupled plasma sweeping source.

FIG. 2 illustrates one embodiment of characteristic components of an IPVD system 100 having an inductively coupled plasma sweeping source. As shown in FIG. 2, the IPVD system 100 may include three primary sources, a metal source, a high-density plasma source, and a wafer bias source. In general, the metal source is the target(s) 120a-b biased by the DC supply 118. In the embodiment of FIG. 1, the high-density plasma source includes the four plasma sources 116a-d, the distributed RF power coupling and matching unit 114, and the first RF generator 112. The wafer bias source may include the second RF generator 122 coupled to the wafer support 124.

In such embodiments, several characteristics or requirements impose limitations and design parameters for the metal source. Such characteristics include the geometry of the plasma chamber, the target-to-substrate distance, the magnetic field within the chamber, the type of target material to be bombarded, the DC bias level at the target, uniform target erosion requirements, desired metal source lifetime, ergonomic design, cost parameters including cost of ownership (COO), and maintenance requirements.

The neutral metal inside chamber is produced by metal source which is done by sputtering of the target surface. Metal transport from target is characterized by thermalization length. Thermalization length depends on pressure in chamber. The achievement of thermalization of the metal is important factor for efficient ionization of neutral metal. High ionization ratio of ionized metal to neutral metal and, more specific, in respect also to plasma density is important for high aspect ratio (HAR) process performance at the wafer surface.

In an embodiment, the several parameters also place limitations on plasma source designs, including for example, plasma pressure requirements, reactor geometry, plasma density, plasma uniformity and size of the plasma field, shielding of plasma sources, plasma coupling to the wafer surface, and antenna design parameters, including the inductance of the antenna.

Further, the wafer bias source is also constrained by certain design parameters, including how controllable the bias charge is across the wafer, the power level, the frequency, pulsing, and other power fluctuations or patterns. One of ordinary skill will recognize further design parameters which may be considered when designing the IPVD systems described herein. For example, metallic ions are transported from high density plasma region by ambipolar diffusion towards a wafer surface and accelerated by sheath voltage. Sheath voltage is controlled by wafer bias power to provide uniform and conformal deposition of metal into HAR features.

Figure 3:
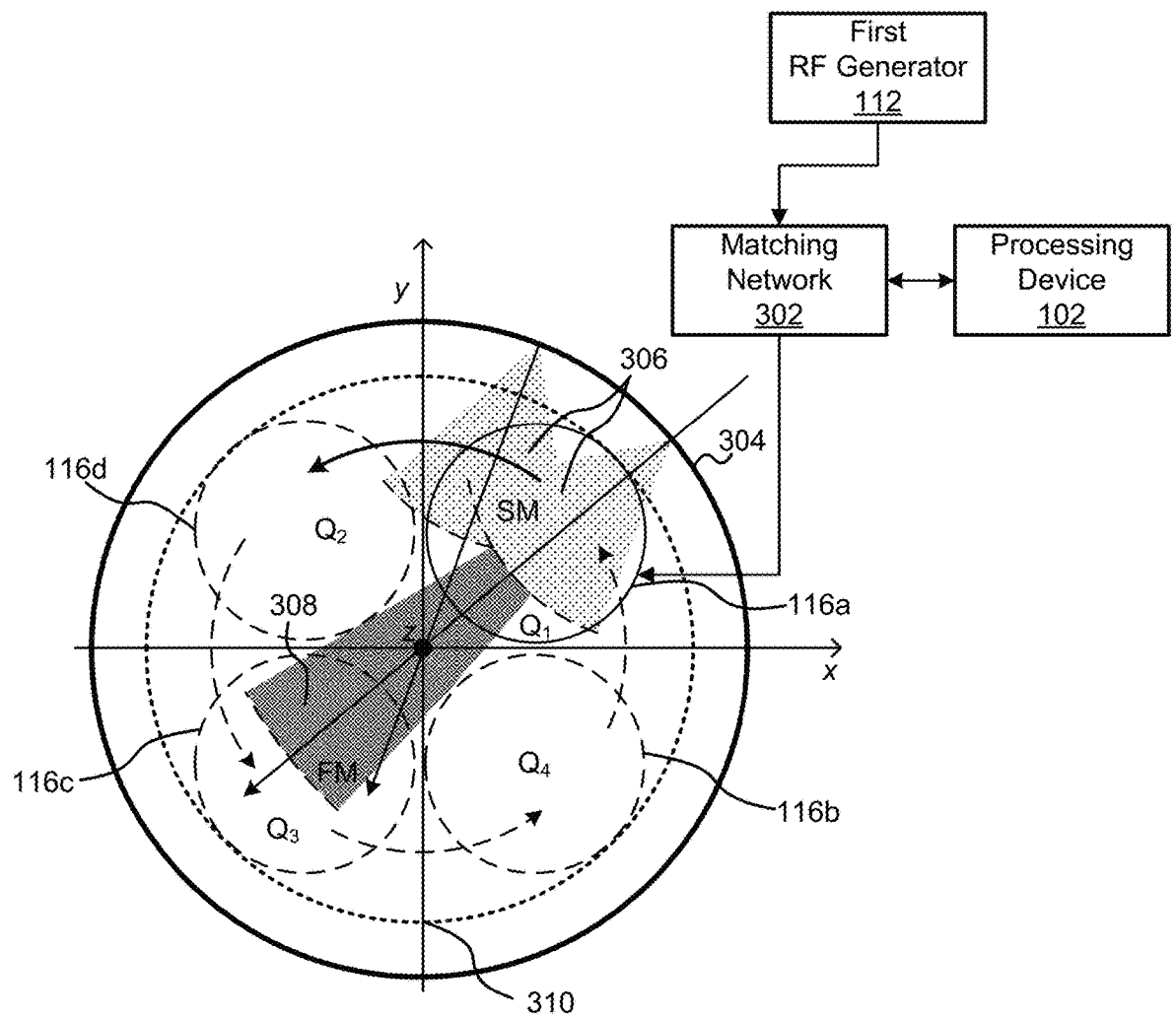
FIG. 3 illustrates one embodiment of an IPVD apparatus having an inductively coupled plasma sweeping source.

FIG. 3 illustrates one embodiment of an IPVD apparatus having an inductively coupled plasma sweeping source. In an embodiment, the plasma source includes a first RF generator 112 coupled to a matching network 302. The matching network may also be coupled to a processing device 102. In one embodiment the matching network 302 may be the distributed RF power coupling and matching unit 114 illustrated in FIG.

In an embodiment, the matching network 302 may receive RF power from the first RF generator 112, and convey that power to the plasma sources 116a-d (labeled Q1-Q4 respectively). In an embodiment, a flux of slow metal atoms 306 and a flux of fast metal ions 308 may be ejected by a source 304. The activation of the plasma sources 116a-d may simultaneously rotate about an axis (z) thereby sweeping the metal ions more uniformly within the chamber (not shown). An RF transparent deposition baffle 310 may further distribute the power generated by the plasma sources 116a-d.

In an embodiment, the power magnitude and frequency supplied by the first RF generator 112, the conditioning and patterning of the RF power supplied to the sources 116a-d by the matching network 302, the rate and pattern of source sweeping, and the like, may each be controlled by the processing device 102 according to a selected sweeping algorithm.

The purpose of the sweeping mode is rather to create highly uniform plasma inside the chamber over a short time period and further modify plasma distribution in temporal (transient) manner to extremely uniform density of metal ion density. This approach is different than modifying static plasma distribution that is typically restricted by chamber geometry and does not offer sufficient in-situ flexibility to comply with process variation (ex-situ), particularly when applied in large-wafer applications.

The embodiment of FIG. 3 includes four high-density plasma sources (ICPs) 116a-d placed in individual quarters of the chamber, but the number of high-density plasma sources is not limited to four. Indeed, the number of sources depends on tradeoffs between development cost, complexity of operation, substrate size and process requirements.

Metal is sputtered from the target 304 with axial symmetry and transported in radial direction passing through the ionization zone of the closest high-density plasma source (e.g., $Q_1$) where slow metal atoms 306 will get ionized and fast neutral atoms 308 will pass up to the ionization zone $Q_3$ and undergo ionization as well. Ionization zone $Q_1$ may be more effective to ionize sputtered flux from target at increased pressures (above 50 mTorr) and zone $Q_3$ is more effective at reduced pressures (below 50 mTorr). In fact, ionization both at "short" distance and "long" distance from target surface occurs instantly. Due to axial symmetry of the reactor, the transport described above also works for any other radial direction in proximity to the sweeping sources 116*a-d* in FIG. 3.

Thus, the neutral metal transport is directed through a high-density plasma region that provides efficient ionization of metallic neutrals. Individual high-density plasma sources 116*a-d* are represented by inductively coupled plasma. The ICP antennas are powered by single or multiple RF power generators 112 through individual matching network 302 with reflected power controller to match plasma and antenna impedance. Biasing of the ICP sources $Q_1$, $Q_2$, $Q_3$ and $Q_4$ may be provided in an azimuthally sequential manner. However, in some embodiments, two or more non-sequential sources can operate also simultaneously. Therefore, the ICPs power may be controlled in various degrees of overlapping operation of at least two ICP sources.

Tables 1 to 5 show variety of such operations:

TABLE 1

Non-overlapping operation of the 4Q-sweeping source.

| Source | Rotational sweep | | | |
|---|---|---|---|---|
| | $\Delta T_{1000}$ | $\Delta T_{0200}$ | $\Delta T_{0030}$ | $\Delta T_{0004}$ |
| $Q_1$ | ON | OFF | OFF | OFF |
| $Q_2$ | OFF | ON | OFF | OFF |
| $Q_3$ | OFF | OFF | ON | OFF |
| $Q_4$ | OFF | OFF | OFF | ON |

TABLE 2

Overlapping operation of the 4Q-sweeping source in rotational fashion: Overlapping period of two sources is less than 50% of the duty cycle.

| Source | Rotational sweep | | | | | | | |
|---|---|---|---|---|---|---|---|---|
| | $\Delta T_{1004}$ | $\Delta T_{1000}$ | $\Delta T_{1200}$ | $\Delta T_{0200}$ | $\Delta T_{0230}$ | $\Delta T_{0030}$ | $\Delta T_{0034}$ | $\Delta T_{0004}$ |
| $Q_1$ | ON | ON | ON | OFF | OFF | OFF | OFF | OFF |
| $Q_2$ | OFF | OFF | ON | ON | ON | OFF | OFF | OFF |
| $Q_3$ | OFF | OFF | OFF | OFF | ON | ON | ON | OFF |
| $Q_4$ | ON | OFF | OFF | OFF | OFF | OFF | ON | ON |

TABLE 3

Overlapping operation of the 4Q-sweeping source with two sources instantly powered: (a) rotational sweep; (b) axially-symmetric sweep, and (c) mirror-symmetric sweep.

| Source | (a) | | | | (b) | | (c) | |
|---|---|---|---|---|---|---|---|---|
| | $\Delta T_{1004}$ | $\Delta T_{1200}$ | $\Delta T_{0230}$ | $\Delta T_{0034}$ | $\Delta T_{1030}$ | $\Delta T_{0204}$ | $\Delta T_{1200}$ | $\Delta T_{0034}$ |
| $Q_1$ | ON | ON | OFF | OFF | ON | OFF | ON | OFF |
| $Q_2$ | OFF | ON | ON | OFF | OFF | ON | ON | OFF |
| $Q_3$ | OFF | OFF | ON | ON | ON | OFF | OFF | ON |
| $Q_4$ | ON | OFF | OFF | ON | OFF | ON | OFF | ON |

TABLE 4

Overlapping operation of the 4Q-sweeping source with at least three sources instantly powered.

| Source | Rotational sweep | | | | |
|---|---|---|---|---|---|
| | $\Delta T_{1034}$ | $\Delta T_{1204}$ | $\Delta T_{1230}$ | $\Delta T_{1234}$ | $\Delta T_{0234}$ |
| $Q_1$ | ON | ON | ON | ON | OFF |
| $Q_2$ | OFF | ON | ON | ON | ON |
| $Q_3$ | ON | OFF | ON | ON | ON |
| $Q_4$ | ON | ON | OFF | ON | ON |

TABLE 5

Overlapping operation of the 4Q-sweeping source with three sources instantly powered.

| Source | (a) | | (b) | | (c) | | (d) | |
|---|---|---|---|---|---|---|---|---|
| | $\Delta T_{1234}$ | $\Delta T_{0234}$ | $\Delta T_{1234}$ | $\Delta T_{0034}$ | $\Delta T_{1234}$ | $\Delta T_{0004}$ | $\Delta T_{1234}$ | $\Delta T_{0004}$ |
| $Q_1$ | ON | OFF | ON | OFF | ON | OFF | ON | OFF |
| $Q_2$ | ON | ON | ON | OFF | ON | OFF | ON | OFF |
| $Q_3$ | ON | ON | ON | ON | ON | OFF | ON | OFF |
| $Q_4$ | ON | ON | ON | ON | ON | ON | ON | OFF |

The application code 114 and sweeping algorithms may be written in appropriate programing language to create a set of output commands to operate individual high density plasma sources in transient sequence(s) stored in library files 106 at computer memory devices. The library 106 may contain files with pre-programed sequences of sweeping operation based on operator or process engineer inputs. For example, sweeping algorithms may be either proven or new sequence algorithms, sequence algorithms created in the process flow (i.e., based on previously obtained metrology data from process flow, such as data on thickness, deposition rate, composition, conformity, etc.) and process receipts.

For example, in Table 1, a sequential turning ON/OFF operation of individual sources is described that is producing a rotational sweep of high-density plasma due to non-overlapping "ON-status" of the individual ICPs. Table 2 gives sequence of partial overlap of two sources in "ON-status", thus creating rotational sweep of high-density plasma with increased azimuthal extension inside the chamber. Table 3 describes several operations when utilizing "ON-status" of two sources producing either rotational sweep of high dense plasma (Table 3-a), axially-symmetric bi-directional sweep of the high-density plasma (Table 3-b), and mirror-like symmetric sweep of the off-axis high-density plasma (Table 3-c). Last case (Table 3-c) can be operating in bi-directional mode as well as, that is a sequence $\Delta T1200$-$\Delta T0034$ from Table 3-c is followed by sequence $\Delta T0230$-$\Delta T1004$.

Further, more than two ICP sources can be operated in a regime when creating various bi-directional high-density plasma distributions. As an example, Table 4 describes operation with three "ON-status" sources operating in rotational fashion. Combination of sequence ΔT1034 with ΔT1230 will produce unidirectional mirror-like symmetry inside plasma and when followed by sequence ΔT1204 with ΔT0234 then bi-directional plasma distributions will be formed inside chamber.

Combination of full power operation, e.g. ΔT1234 with any other mode $\Delta T_{ijkl}$ (where i, j, k and l are individual sources) will impact plasma uniformity and strength of this impact can be controlled by the duty cycle. This is shown in Table 5, where off-axis asymmetry of the plasma can be compensated by appropriate combination as given in Tables 5-a, Table 5-b, and Table 5-c. Pulsed operation (Table 5-d) will reduce electron and ion temperature of the plasma, it will control ions to neutral ratio, thus contributing to more conformal coverage at the wafer level. Due to reduced electron temperature, molecular gas (typically nitrogen used barrier film deposition) will dissociate in a different manner and affecting conditions for barrier layer formation on the wafer surface.

In an embodiment, sequential operation of the sweeping plasma source 1006a-d will have additional effects on process performance. For example, transport of the ions in plasma, either argon ions or metal ions, is due to ambipolar diffusion. A sweeping operation will create conditions that will increase homogenously lateral (parallel to wafer) components of ion temperature. Without the described sweeping operations, the ambipolar electric field has a significant radial component only, providing plasma spreading and transport towards the wafer and walls. The azimuthal component does not participate significantly on such transport; however, in the described sweeping algorithm the azimuthal component of ambipolar electric field is comparable to radial component and generates more homogeneous distribution of the ion temperature. This effect will have impact on more symmetric and conformal deposition.

Figure 4:
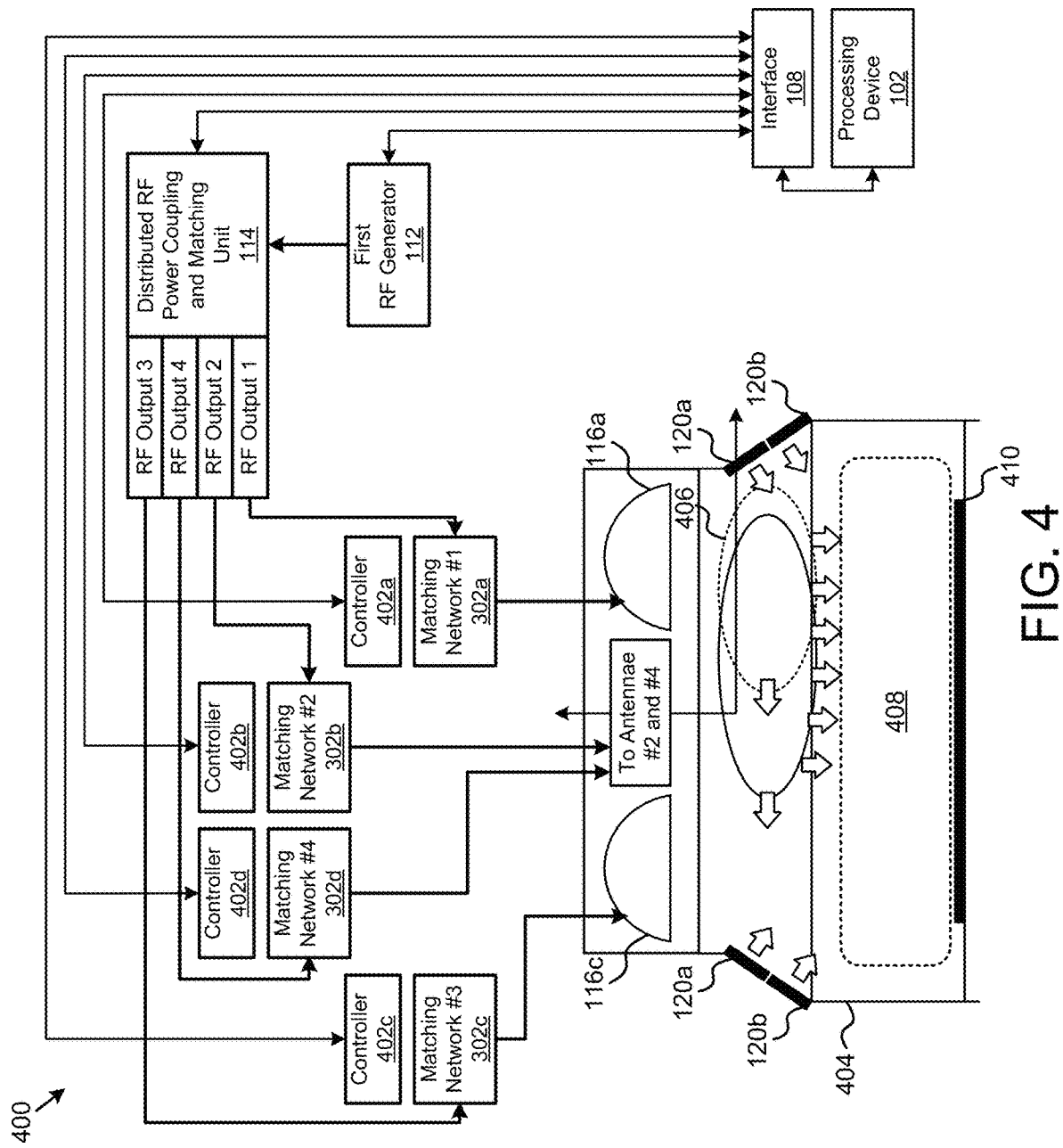
FIG. 4 illustrates a further embodiment of an IPVD system having an inductively coupled plasma sweeping source.

FIG. 4 illustrates a further embodiment of an IPVD system 400 having an inductively coupled plasma sweeping source. In an embodiment, the system 400 generally includes a sweeping high-density plasma source, a metal source, and a wafer bias source. In such an embodiment, the antennas 116a, 116c are illustrated. Each antenna 116a-d is coupled to an RF power generator 112 via an RF power distributed coupling network 114, a controller 402a-d respectively, and a matching network 302a-d respectively. The matching networks 302a-d may provide impedance matching between the antennas 116a-d and the RF distribution network 114 respectively, to avoid reflections and transient signals, which may create inconsistencies in the plasma field distribution.

Sputtered metal from the targets 120a-b may be combined with the high-density plasma field 406 to form a thermalized and ionized metal plasma domain 408 over a surface of a wafer 410. The bias on the wafer provided by the wafer support 124 may cause the metal ions to be directed at the surface of the wafer 410.

Figure 5:
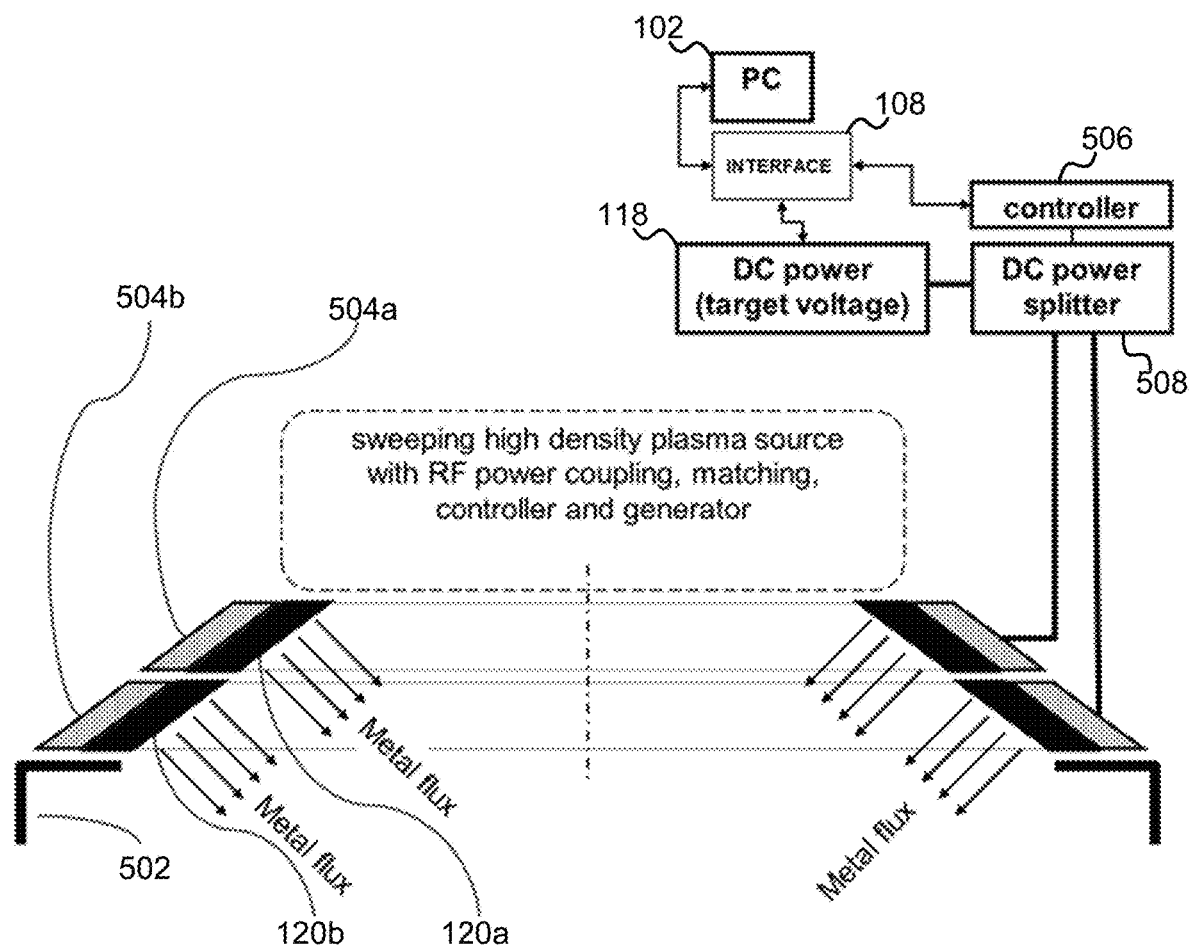
FIG. 5 illustrates a further embodiment of an IPVD apparatus having an inductively coupled plasma sweeping source.

FIG. 5 illustrates a further embodiment of an IPVD apparatus having an inductively coupled plasma sweeping source. FIG. 5 illustrates an embodiment of the metal source. In such an embodiment, the metal source includes the processing device 102 coupled to the interface 108. The interface may be coupled to the DC power supply 118 and to a DC power splitter 508. The DC power splitter 508 may be coupled to a first magnet pack 504a and to a second magnet pack 504b. Each magnet pack 504a-b may be coupled to a target 120a-b respectively. In such an embodiment, metal flux may be distributed within the chamber walls 502.

Figure 6:
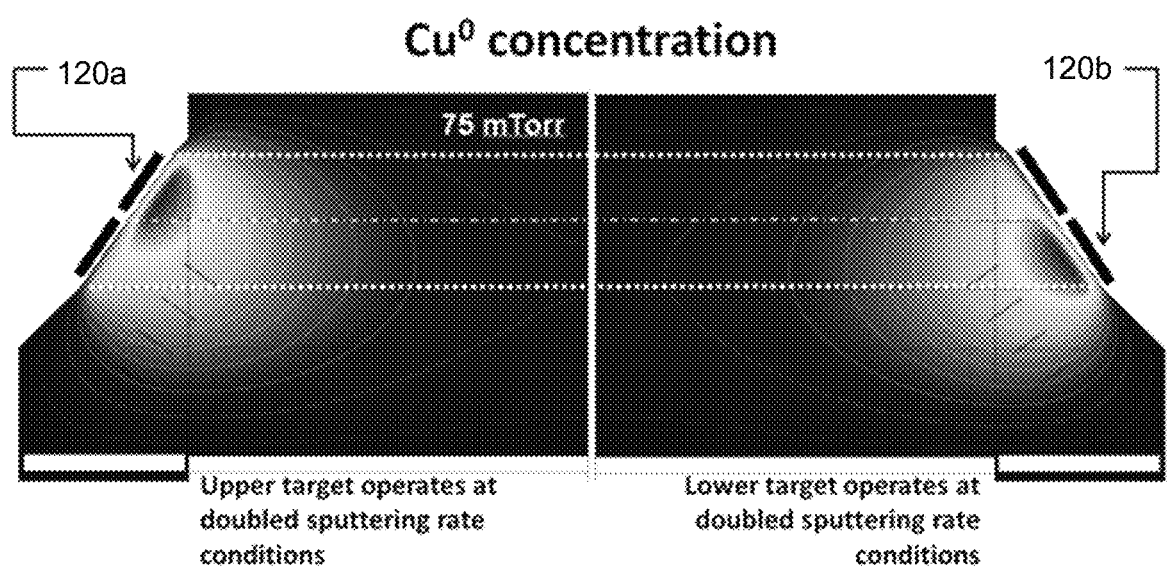
FIG. 6 illustrates a further embodiment of an IPVD apparatus having an inductively coupled plasma sweeping source.

FIG. 6 illustrates the distribution of Cu ion concentration within the chamber at a pressure of 75 mTorr. The upper target 120a and lower target 120b may operate at doubled sputtering rate conditions as compared with typical systems. In one embodiment the metal source is represented by conical (frustum of cone) target. Based on modeling of neutral metal transport at reduced pressure (bellow 50 mTorr) and increased pressure (more or about 50 mTorr) it has been identified that the target size may be in the range around 50 to 60 cm in diameter, with a target width in the range from 75 to 100 mm. In an embodiment, the angle of the target surface from vertical axes is in the range of 30°-40°. Preferably the angle is 35°. Erosion of the target may be controlled by magnetic field assembly (magnet packs 504a-b).

The present embodiments describe a stacked "dual-target" configuration, shown in FIG. 5, that has advantages over single target configuration. In further embodiments, the targets may be stacked conical targets, which allow further control of neutral metal flux distribution into high density plasma zone. Individual targets may be controlled independently by applying DC or AC (lower frequency range or pulsed operation) voltage power supply. In this way, same geometry target assembly will lead to different performance due to variability in sputtering flux from targets. Each of stacked targets may consist of the same material (metal), or each may consist of different materials allowing instantaneous composite film deposition.

Beneficially, the present embodiments may increase deposition rate, and provide independent control of metal flux distribution inside the chamber. In an embodiment, both targets are operated simultaneously, but they are controlled independently. Depending on the ratio of the DC power applied to target the first target 120a and the second target 120b, the metal flux distribution will be modified. Sputtering flux is more intense at both the top target 120a and the bottom target 120b. Indeed, if identical power density is applied to both targets 120a-b at the same voltage, the dual target will act as mono-target. Application of the sweeping plasma source is not affected by mono-target or dual-target operation.

Figure 7:
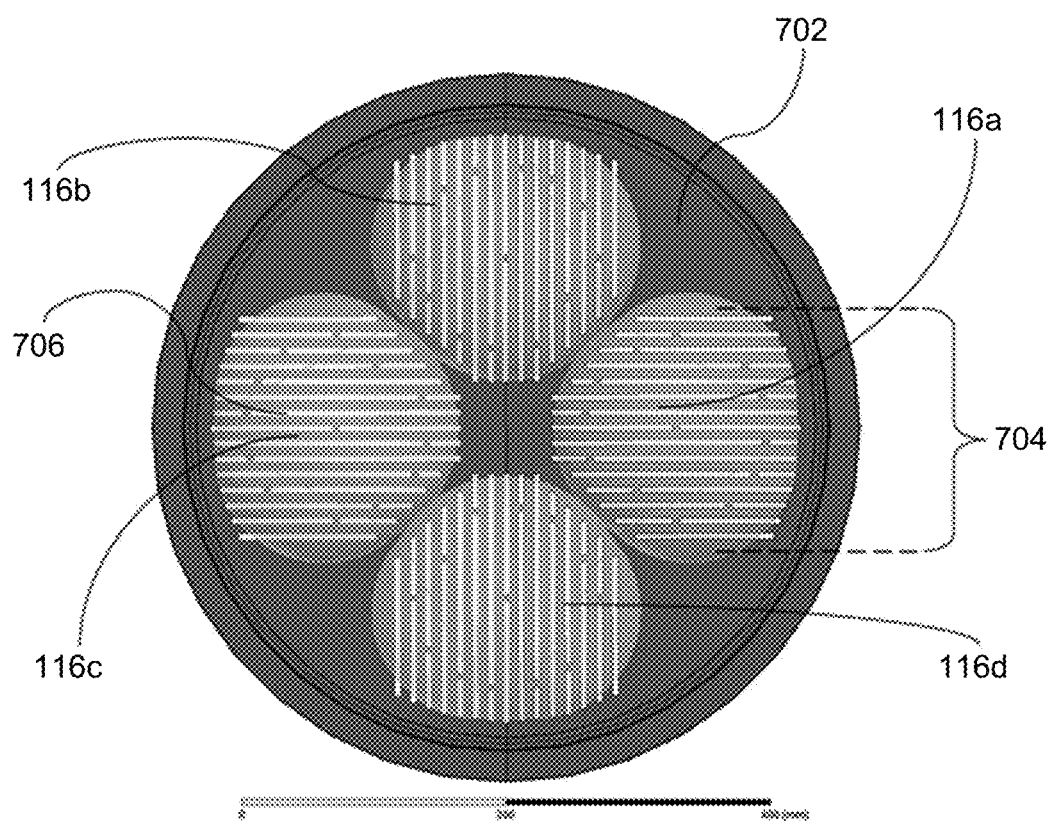
FIG. 7 illustrates an embodiment of an IPVD apparatus having an inductively coupled plasma sweeping source.

FIG. 7 illustrates an embodiment of the plasma source. In an embodiment, the plasma source may include a segmented deposition baffle 702 with RF transparent sections. The source antennas 116a-d may rotate around a central axis. A plurality of sections 704 with slots 706 may allow generation of high-density plasma by the antennas. FIGS. 8-15 illustrate various embodiments of the high-density plasma source with various embodiments of a control and matching network.

Figure 8:
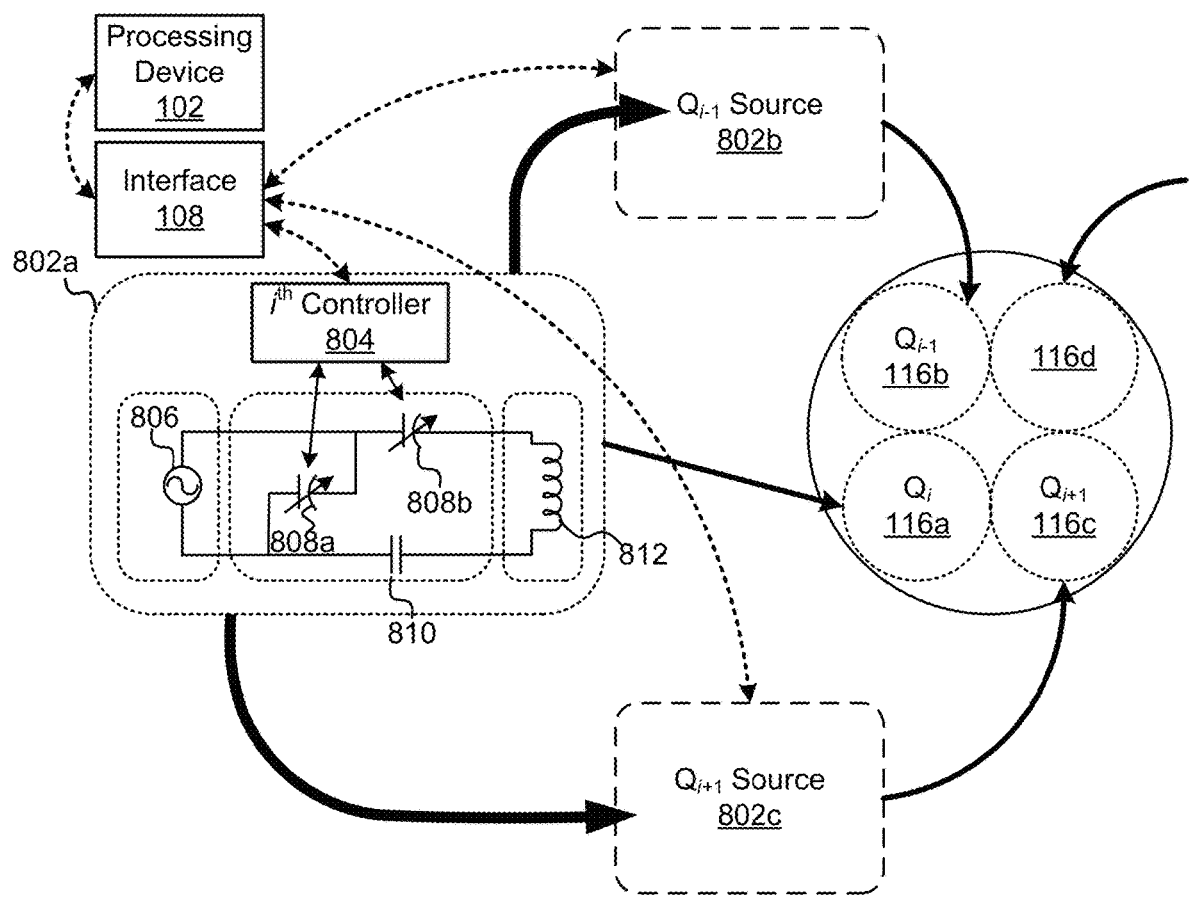
FIG. 8 illustrates an embodiment of an IPVD apparatus having an inductively coupled plasma sweeping source.

In the embodiment of FIG. 8, the processing device 102 communicates with an independent controller 804 and matching unit 802a-d for each source antenna. In such an embodiment, the first matching unit 802a may include a first adjustable capacitor 808a and a second adjustable capacitor 808b. A third capacitor 810 may also be coupled to an inductor 812 for inductively coupling the RF source 806 to the antenna 116a. While this embodiment is the simplest, it also becomes costly when using multiple ICP sources. On the other hand, it offers decoupled ICP sources with independent power delivery into each high-density plasma source 116a-d and also more standard HW may be used for each high density plasma source 116a-d.

Figure 9:
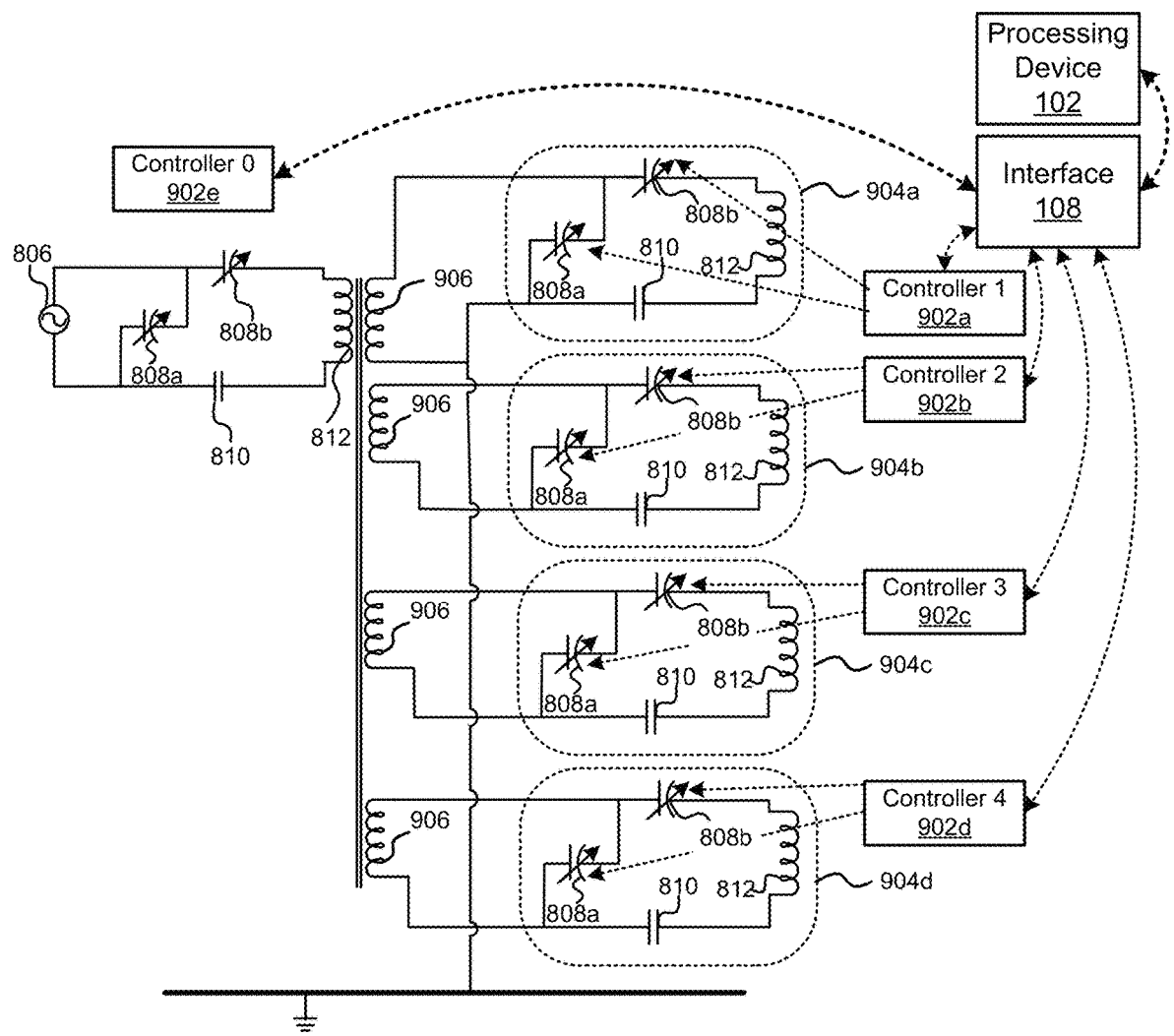
FIG. 9 illustrates another embodiment of an IPVD apparatus having an inductively coupled plasma sweeping source.

In another embodiment, the matching networks are coupled to single RF generator 806 through RF power distributed coupling unit, as shown in FIG. 9. In an embodiment, the RF power distribution coupling unit includes a plurality of inductors 906 for inductively coupling each matching network to the RF power supply 806. An independent controller 902*a-d* may be provided for each matching network 904*a-d* of FIG. 10, and a separate controller 902*e* may be provided for the matching network coupled to the RF generator 906 of FIG. 9. This embodiment may significantly reduce cost due to reduction of the RF generators to only one RF generator 906. Each matching unit (MU) 904*a-d* may include at least two variable capacitors 808*a* and 808*b* and may be used to match transformer impedance with either full load—including antennas and plasma load, partial or impedance when unloaded operation to generator output impedance.

Proposed transformer has primary winding 812 and four secondary windings 906. Number of secondary windings depends on number of individual ICP sub-sources 904*a-d*. The ratio of turns in primary 812 and secondary 906 section of the transformer can be designed to match the antenna coupled to plasma load to the output impedance of the RF power generator. Secondary windings 906 have one end in common and are acting in parallel to divide primary current into four secondary currents. The transformer load may depend on plasma conditions (conductivity) and the number of involved ICP sources. In an embodiment, the transformer may distribute RF current through secondary windings into several branches (four in this particular embodiment). As shown in FIG. 9, these equivalent outputs are applying the RF power through individual "L-type" matching networks in push-pull configuration into each antenna 116*a-d*, thereby powering individual $Q_1$ to $Q_4$ high-density plasma sources.

Figure 10:
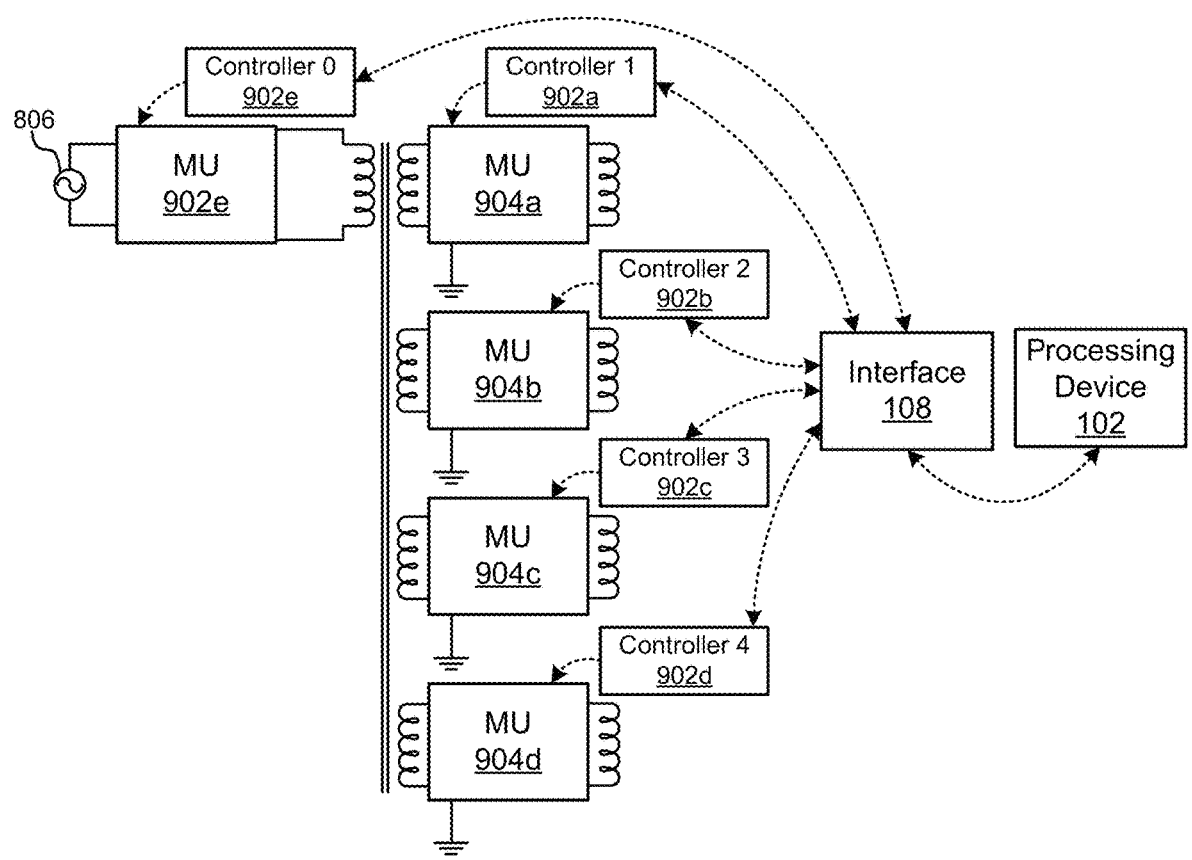
FIG. 10 illustrates another embodiment of an IPVD apparatus having an inductively coupled plasma sweeping source.

Although one particular embodiment of a plasma source is described in FIG. 9, one of ordinary skill will recognize that various alternative embodiments exist. For example, each of the matching units 902*a-e* may be include alternative configurations, such as those illustrated in FIGS. 13-15. In the embodiment of FIG. 10, each MU 904*a-d* may be inductively coupled to the RF generator and MU 902*e*. Each MU 904*a-d* may be further coupled to source antennas 116*a-d*. In such an embodiment, the processing device 102 may control each controller 902*a-e* independently.

Figure 11:
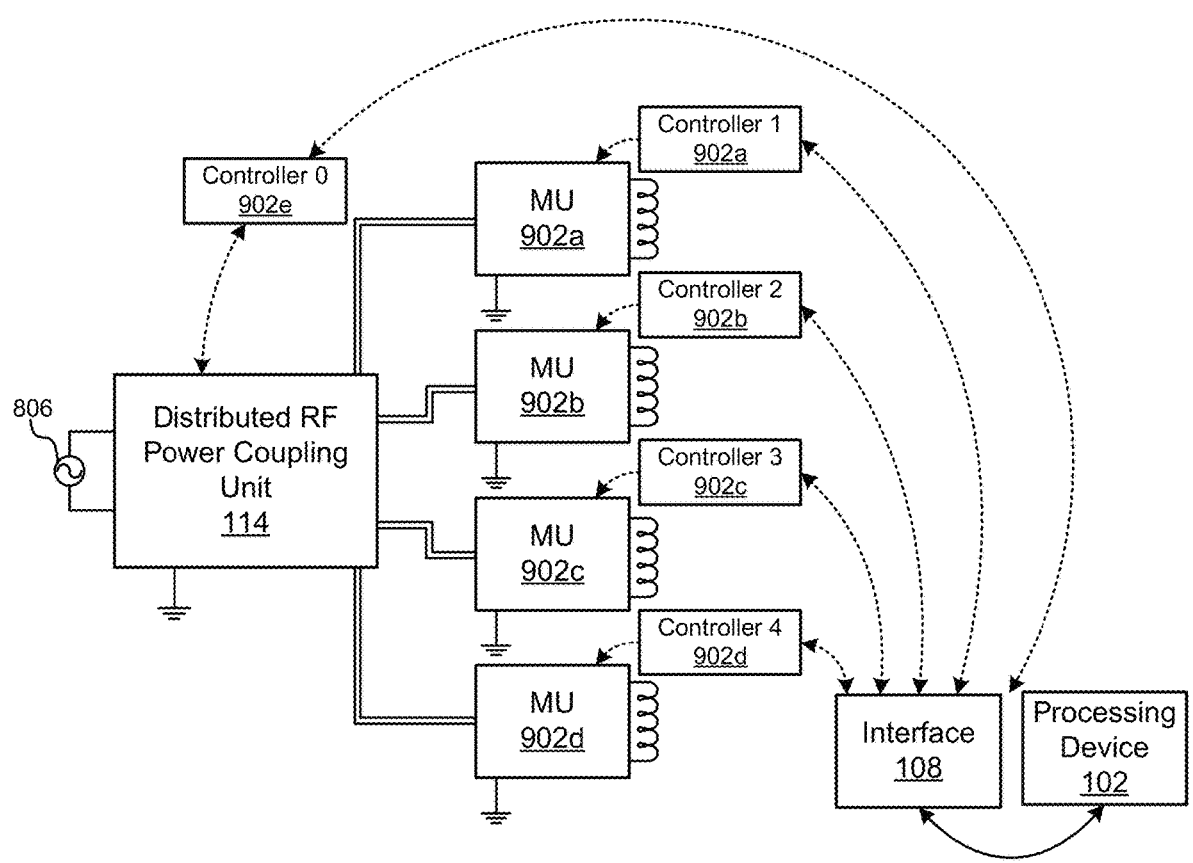
FIG. 11 illustrates another embodiment of an IPVD apparatus having an inductively coupled plasma sweeping source.

The embodiment of FIG. 11 is similar to the embodiment of the system illustrated in FIG. 4. In such an embodiment, each MU 902*a-d* may be directly coupled to the distributed RF power coupling unit 114, rather than inductively coupled.

In an embodiment, the RF distributed power coupling unit 114 may split total power into several outputs with same RF power and sustain matching conditions with output impedance of the RF generator. When all high density plasma sources 116*a-d* are active, then total power is equal to sum of split power values.

$$P_{total} = P_{Q1} + P_{Q2} + P_{Q3} + P_{Q4}$$

Figure 12A:
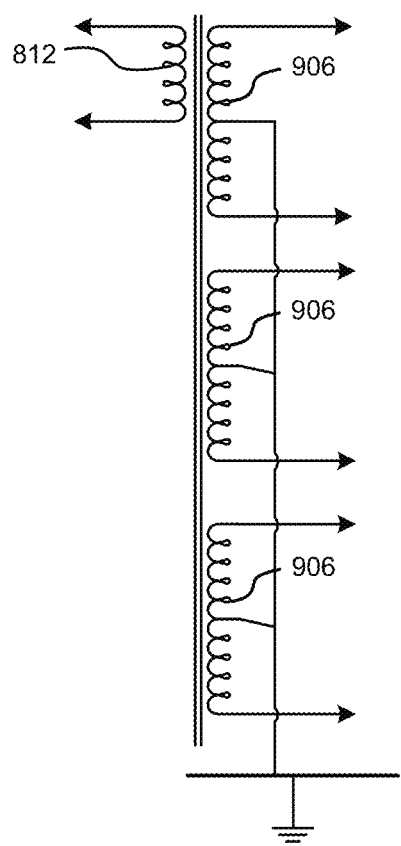
FIG. 12A illustrates an embodiment of a power supply for an IPVD apparatus having an inductively coupled plasma sweeping source.

The RF power distributed coupling unit may be built using transformer coupling principles or other RF circuitry concepts, and may operate in balanced or asymmetric modes. For example, secondary windings of RF transformer may use either end terminated to common ground, as it is shown in FIG. 9, or may be terminated to ground at the center of each secondary winding as shown in FIG. 12A.

Figure 12B:
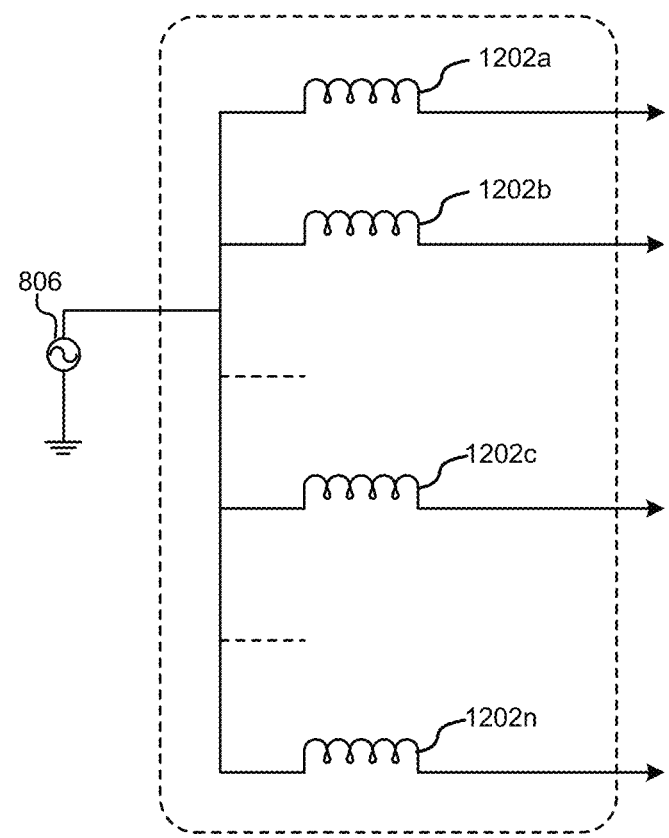

If a push-pull operation is selected for the antennas, a modified version of a 3D antenna may be used. The push-pull, or balanced, driving of the antenna may be provided by the variable capacitor(s) for each source, as shown in FIG. 9. Other methods may be used to provide balanced RF power to antenna. For example, the secondary windings may have common and grounded terminals in the middle of the winding as shown in FIG. 12A. Another embodiment includes a set of parallel inductors 1202*a-n* with a common end, may be configured as a power divider, while the same voltage is sustained at the input terminal of matching units, as shown in FIG. 12B.

Figure 13:
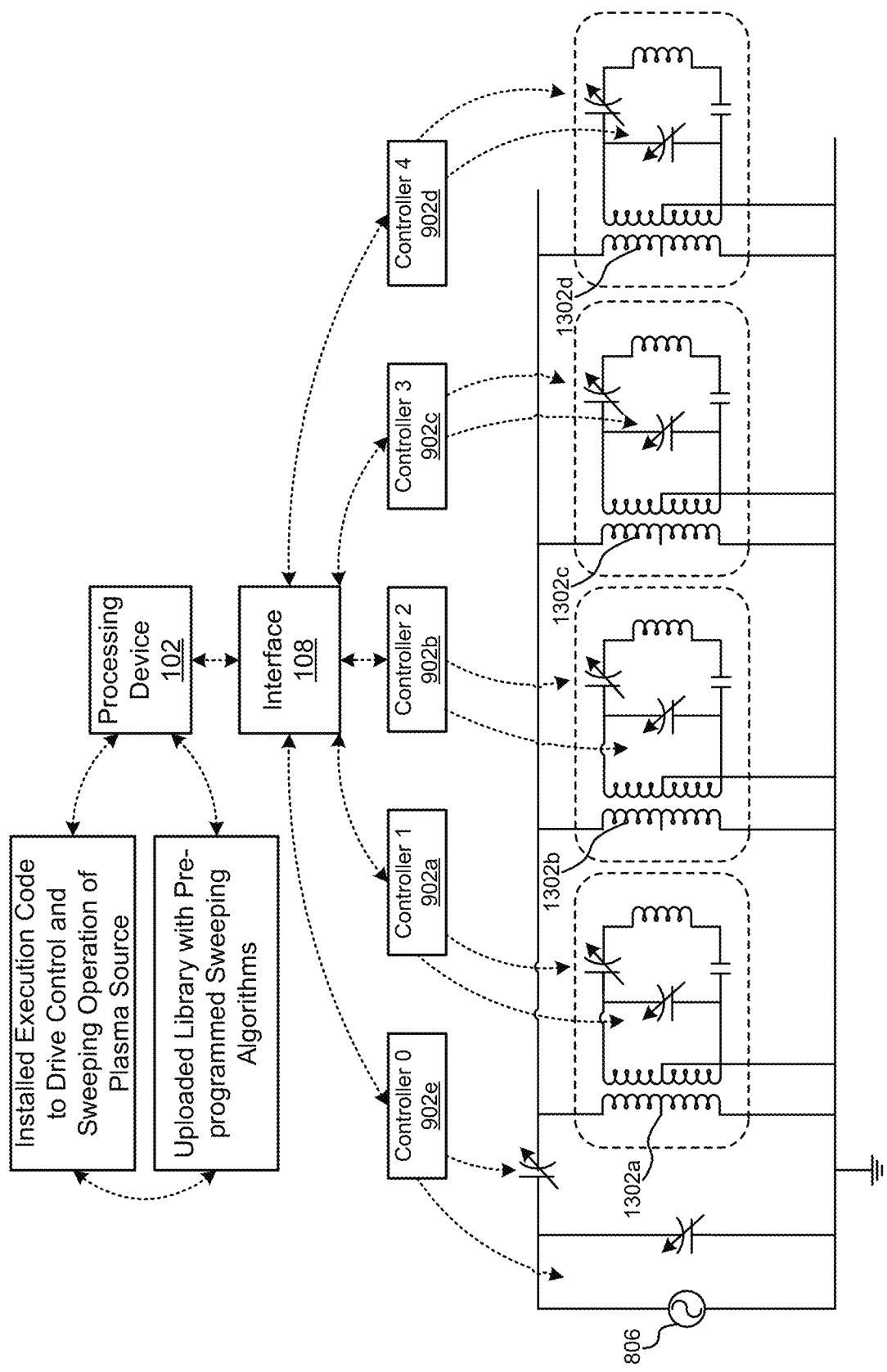
FIG. 13 illustrates another embodiment of an IPVD system having an inductively coupled plasma sweeping source.

In the embodiment of FIG. 13, a single RF generator 806 is coupled to four different transformers 1602*a-d*, each delivering an equal portion of the total RF power into the input ports of the matching unit of each high-density plasma source 116*a-d*. An advantage of this embodiment, as compared to that of FIG. 9, is that instead of one technically more complex multi-winding transformer a simpler design with two windings may be used. In such an embodiment, the two windings may be configured as part of the matching units. Push-pull operation of this embodiment may be arranged similarly to a combination of the embodiments shown in FIG. 9 and FIG. 12A.

Figure 14:
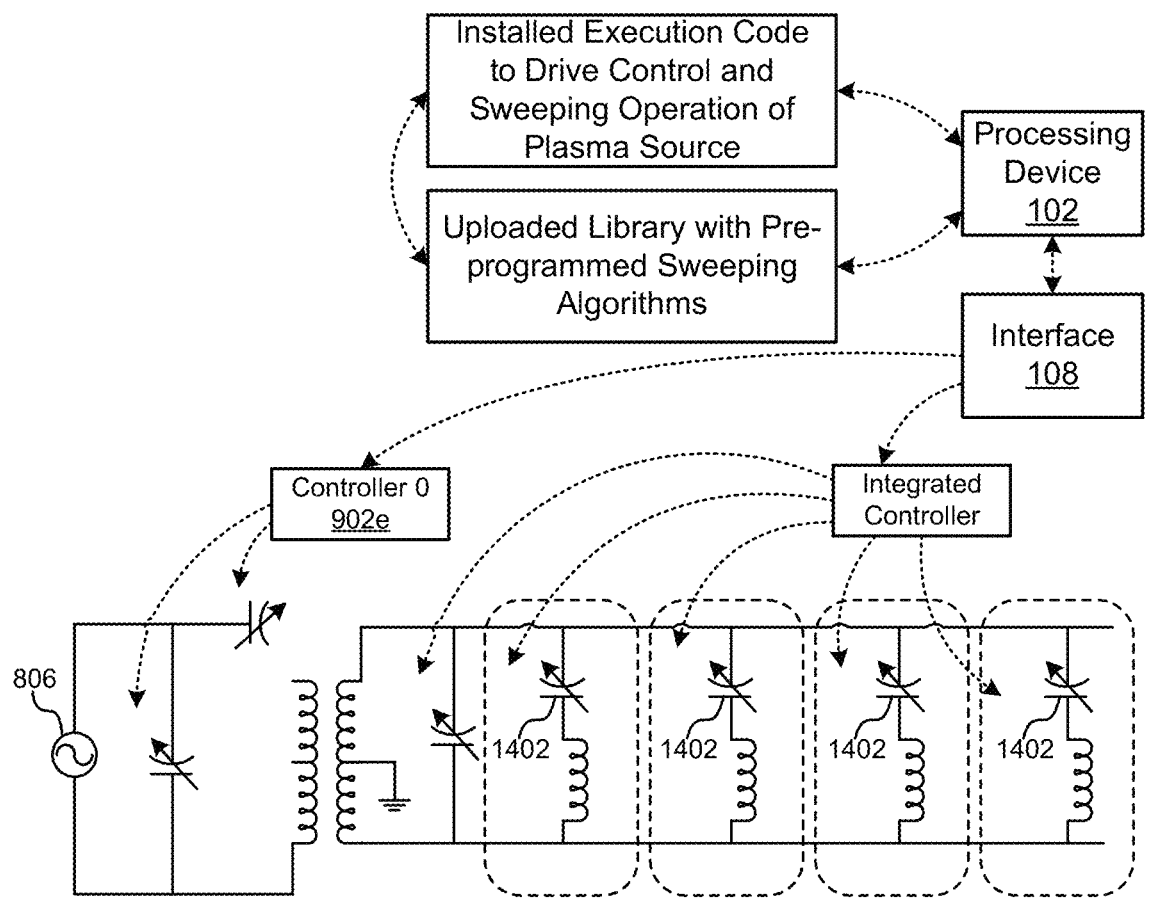
FIG. 14 illustrates another embodiment of an IPVD system having an inductively coupled plasma sweeping source.

An embodiment of the distributed RF power coupling and matching unit 114 from FIG. 1 is further illustrated in FIG. 14. In such an embodiment, the number of components in RF circuitry may be reduced, while making the RF unit design even more integrated with antennas 116*a-d*. FIG. 14 illustrates a balanced (push-pull) RF driver utilizing a transformer with mid-terminal grounding. Further variable capacitors 808*a-b* are eliminated in individual matching units and are replaced by single variable capacitor 1402. This in part simplifies controller design with only one variable capacitor 1402 per antenna.

Figure 15:
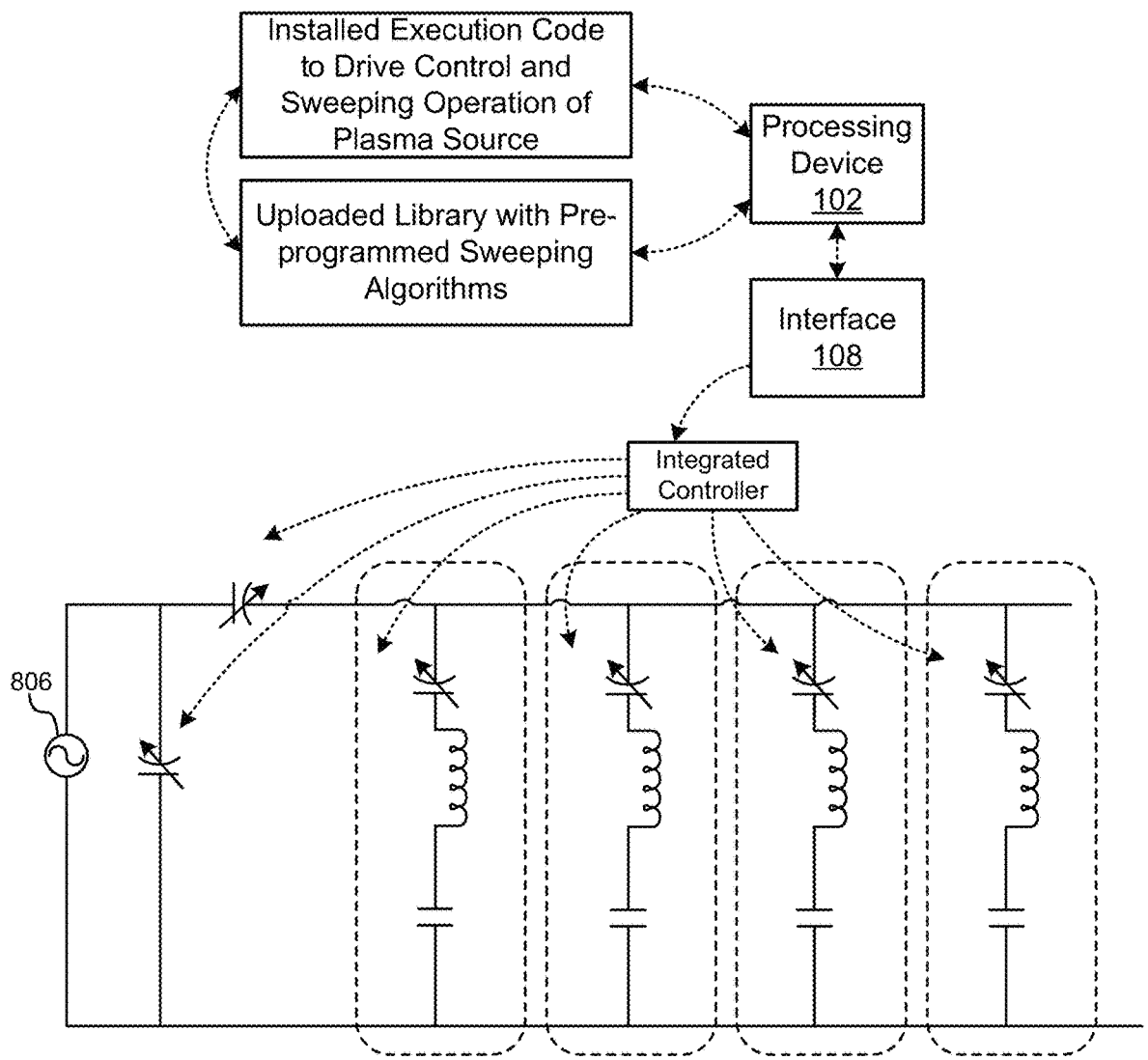
FIG. 15 illustrates another embodiment of an IPVD system having an inductively coupled plasma sweeping source.

Another embodiment is shown in FIG. 15. This configuration eliminates the RF transformer. In an embodiment, balanced operations are achieved using the combination of the variable capacitors and the inductances shown in each matching unit, which is similar in operation to the embodiment shown in FIG. 12B. Thus antennas 116*a-d* themselves may form a portion of the current divider. The maximum RF currents in each branch may be tuned by variable capacitors and the total RF power may be maximized by capacitor constant capacitors which are tuned to minimize reflected RF power from sweeping plasma source 116*a-d* as a whole assembly with highly structured impedance.

Figure 16:
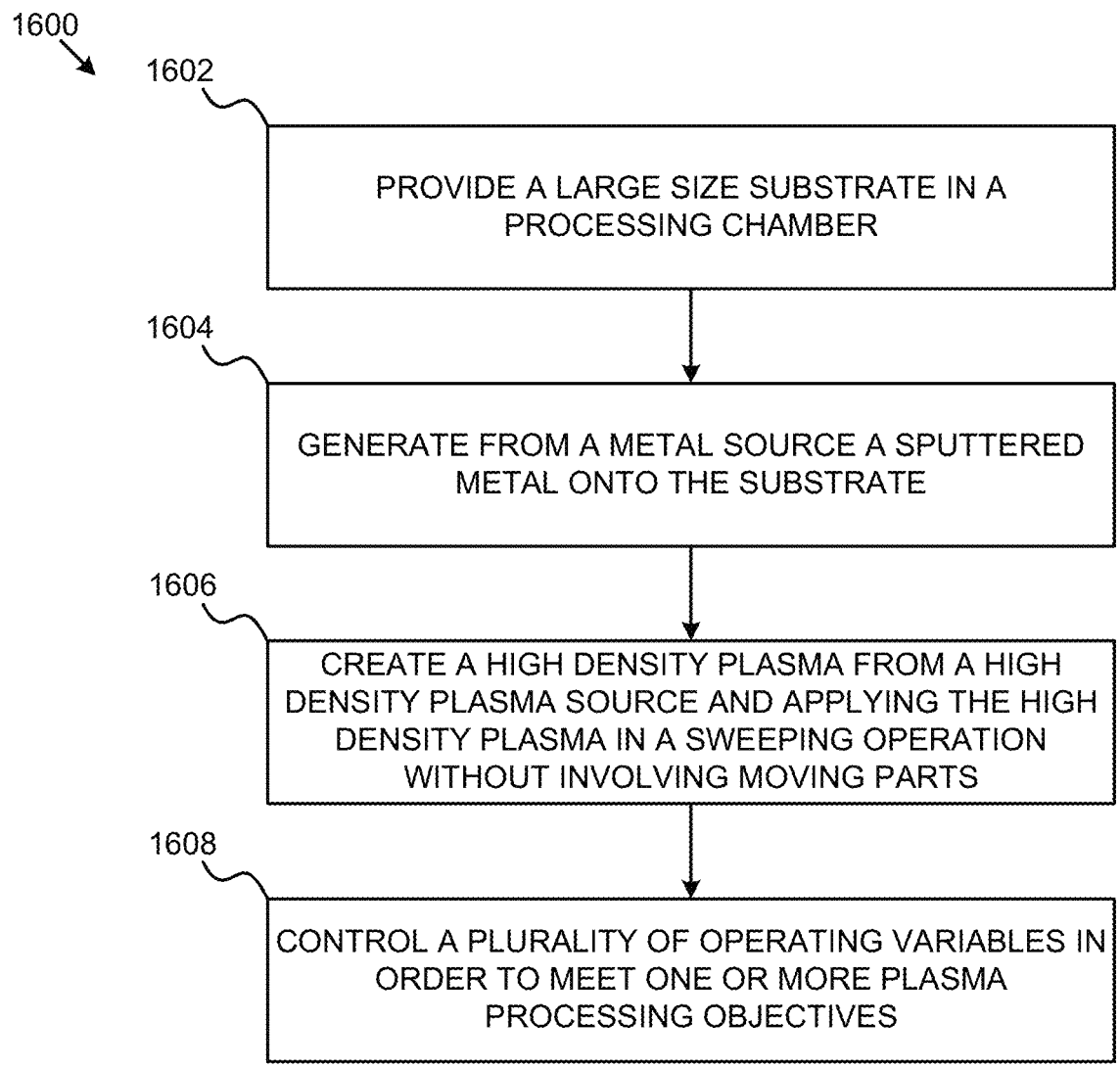
FIG. 16 illustrates a flowchart diagram of a method for operation of an IPVD system having an inductively coupled plasma sweeping source.

FIG. 16 illustrates a flowchart diagram of a method 1600 for operation of an IPVD system having an inductively coupled plasma sweeping source. In an embodiment, the method 1600 includes providing a large size substrate in a processing chamber as illustrated in block 1602. At block 1604, the method 1600 includes generating from a metal source a sputtered metal onto the substrate. The method 1600 also includes creating a high-density plasma from a high-density plasma source and applying the high-density plasma in a sweeping operation without involving moving parts, as shown at block 1606. At block 1608, the method 1600 includes controlling a plurality of operating variables in order to meet one or more plasma processing objectives.

Figure 17:
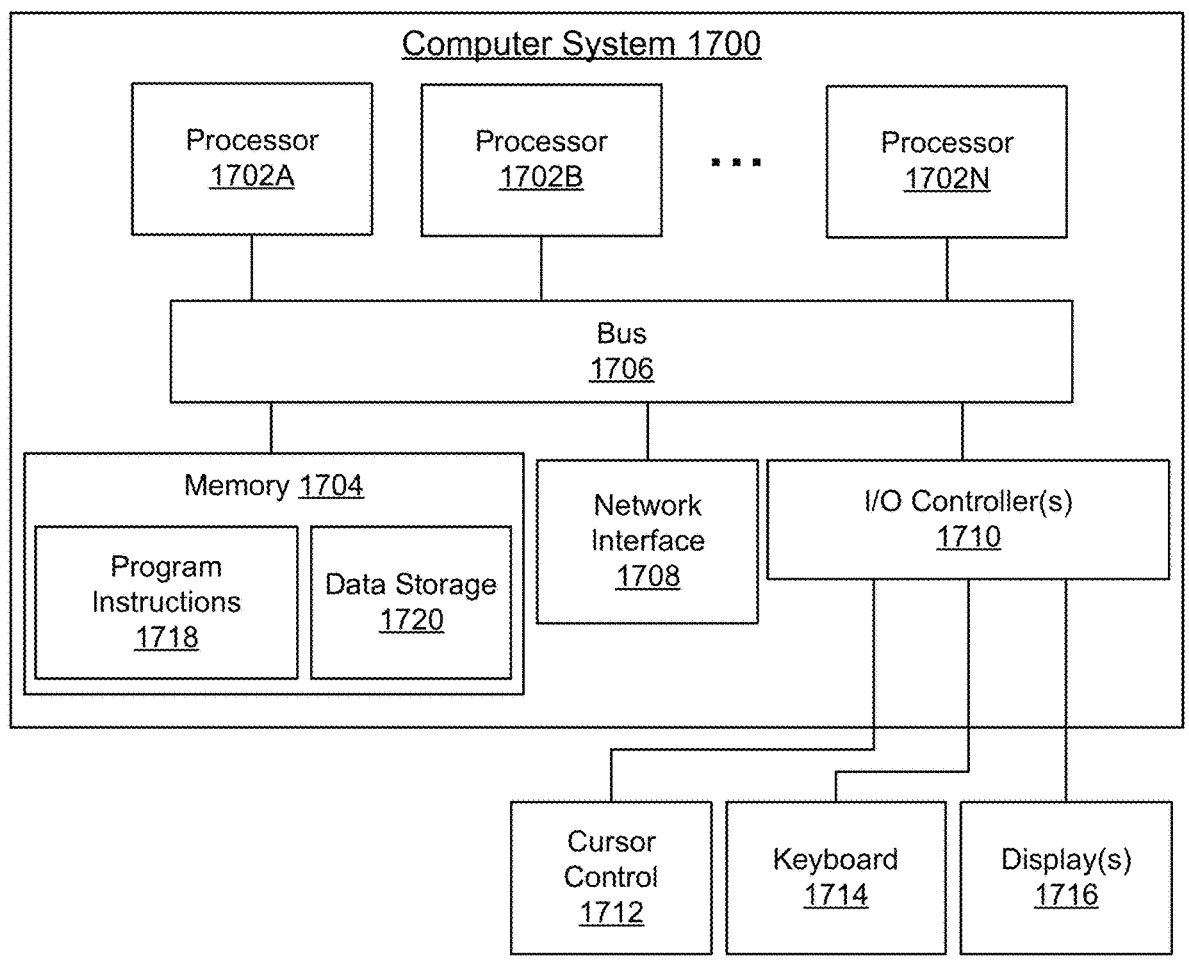
FIG. 17 illustrates an embodiment of a computer system specially configured for use with an IPVD system having an inductively coupled plasma sweeping source.

FIG. 17 is a schematic block diagram illustrating one embodiment of a computer system 1700 specially configured for use with an IPVD system having an inductively coupled plasma sweeping source. In one embodiment, the processing device 102 may be implemented on a computer system similar to the computer system 1700 described in FIG. 17. Similarly, controllers 902*a-e* may be implemented on a computer system similar to the computer system 1700 described in FIG. 17. Other components of the systems described herein may also be implemented on a computer system similar to the computer system 1700. In various embodiments, computer system 1700 may be a server, a mainframe computer system, a workstation, a network computer, a desktop computer, a laptop, or the like.

As illustrated, computer system 1700 includes one or more processors 1702A-N coupled to a system memory 1704 via bus 1706. Computer system 1700 further includes network interface 1708 coupled to bus 1706, and input/output (I/O) controller(s) 1710, coupled to devices such as cursor control device 1712, keyboard 1714, and display(s) 1716. In some embodiments, a given entity (e.g., processing device 102) may be implemented using a single instance of computer system 1700, while in other embodiments multiple such systems, or multiple nodes making up computer system 1700, may be configured to host different portions or instances of embodiments (e.g., controllers 902a-e).

In various embodiments, computer system 1700 may be a single-processor system including one processor 1702A, or a multi-processor system including two or more processors 1702A-N (e.g., two, four, eight, or another suitable number). Processor(s) 1702A-N may be any processor capable of executing program instructions. For example, in various embodiments, processor(s) 1702A-N may be general-purpose or embedded processors implementing any of a variety of instruction set architectures (ISAs), such as the x86, POWERPC®, ARM®, SPARC®, or MIPS® ISAs, or any other suitable ISA. In multi-processor systems, each of processor(s) 1702A-N may commonly, but not necessarily, implement the same ISA. Also, in some embodiments, at least one processor(s) 1702A-N may be a graphics processing unit (GPU) or other dedicated graphics-rendering device.

System memory 1704 may be configured to store program instructions and/or data accessible by processor(s) 1702A-N. For example, memory 1704 may be used to store software program and/or database shown in FIG. 16. In various embodiments, system memory 1704 may be implemented using any suitable memory technology, such as static random access memory (SRAM), synchronous dynamic RAM (SDRAM), nonvolatile/Flash-type memory, or any other type of memory. As illustrated, program instructions and data implementing certain operations, such as, for example, those described above, may be stored within system memory 1704 as program instructions 1718 and data storage 1720, respectively. In other embodiments, program instructions and/or data may be received, sent or stored upon different types of computer-accessible media or on similar media separate from system memory 1704 or computer system 1700. Generally speaking, a computer-accessible medium may include any tangible, non-transitory storage media or memory media such as electronic, magnetic, or optical media—e.g., disk or CD/DVD-ROM coupled to computer system 1700 via bus 1706, or non-volatile memory storage (e.g., "flash" memory)

In an embodiment, bus 1706 may be configured to coordinate I/O traffic between processor 1702, system memory 1704, and any peripheral devices including network interface 1708 or other peripheral interfaces, connected via I/O controller(s) 1710. In some embodiments, bus 1706 may perform any necessary protocol, timing or other data transformations to convert data signals from one component (e.g., system memory 1704) into a format suitable for use by another component (e.g., processor(s) 1702A-N). In some embodiments, bus 1706 may include support for devices attached through various types of peripheral buses, such as a variant of the Peripheral Component Interconnect (PCI) bus standard or the Universal Serial Bus (USB) standard, for example. In some embodiments, the operations of bus 1706 may be split into two or more separate components, such as a north bridge and a south bridge, for example. In addition, in some embodiments some or all of the operations of bus 1706, such as an interface to system memory 1704, may be incorporated directly into processor(s) 1702A-N.

Network interface 1708 may be configured to allow data to be exchanged between computer system 1700 and other devices, such as other computer systems attached to data processor 102, for example. In various embodiments, network interface 1708 may support communication via wired or wireless general data networks, such as any suitable type of Ethernet network, for example; via telecommunications/telephony networks such as analog voice networks or digital fiber communications networks; via storage area networks such as Fiber Channel SANs, or via any other suitable type of network and/or protocol.

I/O controller(s) 1710 may, in some embodiments, enable connection to one or more display terminals, keyboards, keypads, touch screens, scanning devices, voice or optical recognition devices, or any other devices suitable for entering or retrieving data by one or more computer system 200. Multiple input/output devices may be present in computer system 1700 or may be distributed on various nodes of computer system 1700. In some embodiments, similar I/O devices may be separate from computer system 1700 and may interact with computer system 1700 through a wired or wireless connection, such as over network interface 1708.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

As shown in FIG. 17, memory 1704 may include program instructions 1718, configured to implement certain embodiments described herein, and data storage 1720, comprising various data accessible by program instructions 1718. For example, program instructions 1718 may include the application code 104 and/or the sweeping algorithm library 106. In an embodiment, program instructions 1718 may include software elements of embodiments illustrated in FIG. 16. For example, program instructions 1718 may be implemented in various embodiments using any desired programming language, scripting language, or combination of programming languages and/or scripting languages. Data storage 1720 may include data that may be used in these embodiments such as, for example, sweeping algorithm files. In other embodiments, other or different software elements and data may be included.

A person of ordinary skill in the art will appreciate that computer system 1700 is merely illustrative and is not intended to limit the scope of the disclosure described herein. In particular, the computer system and devices may include any combination of hardware or software that can perform the indicated operations. In addition, the operations performed by the illustrated components may, in some embodiments, be performed by fewer components or distributed across additional components. Similarly, in other embodiments, the operations of some of the illustrated components may not be performed and/or other additional operations may be available. Accordingly, systems and methods described herein may be implemented or executed with other computer system configurations.

Embodiments of controllers 902*a-e* described in FIG. 9 may be implemented in a computer system that is similar to computer system 1700. In one embodiment, the elements described in controllers 902*a-e* may be implemented in discrete hardware modules. Alternatively, the elements may be implemented in software-defined modules which are executable by one or more of processors 1702A-N, for example.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What I claim:

1. A system for plasma processing comprising:
    a metal source configured to supply a metal for ionized physical vapor deposition on a substrate in a process chamber, wherein the metal source comprises a first conical target located above a second conical target, wherein the first and second conical targets generate a metal flux from the metal, and wherein an outer circumference of the first conical target is within an outer circumference of the second conical target;
    a high-density plasma source configured to generate a dense plasma;
    a substrate bias source configured to provide a potential necessary to thermalize and ionize the plasma; and
    a controller configured to control the high-density plasma source so that different power levels are applied at different circumferential locations during processing of the substrate and power levels are changed at the different circumferential locations during processing of the substrate, and wherein a power level sequence timing of one circumferential location is different from a power level sequence timing of an adjacent circumferential location;
    wherein the substrate is 300 mm or larger.

2. The system of claim 1, wherein the first and second conical targets are coupled to a direct current power splitter, wherein the first conical target is coupled to a first magnet pack and the second conical target is coupled to a second magnet pack, the first and second conical targets and the first and second the magnet packs positioned proximate a chamber wall.

3. The system of claim 2, wherein the first conical target operates at a doubled sputtering rate condition; and
    the second conical target operates at a doubled sputtering rate condition.

4. The system of claim 3, wherein the high density plasma source comprises:
    a radio frequency (RF) generator configured to generate RF waves;
    a matching network configured to transmit RF power; and
    a deposition baffle configured to be transparent to RF.

5. The system of claim 4, wherein the high-density plasma source comprises two or more high-density plasma sources.

6. The system of claim 5, wherein the high-density plasma source comprises four high-density plasma sources, wherein each source is the same size.

7. The system of claim 5, wherein the high-density plasma source comprises six or more high-density plasma sources, wherein each source is the same size.

8. The system of claim 5, wherein the deposition baffle contains segments with slots configured to enable optimization of temperature distribution across an area of the deposition baffle.

9. The system of claim 5, wherein the process chamber includes a sputtered metal area, a high density plasma area, and a thermalized and ionized metal plasma area.

10. The system of claim 5, wherein the process chamber further comprises a transmission area disposed above a plasma area, the transmission area containing plural antennas of an inductively coupled plasma sweeping source.

11. The system of claim 4, wherein the matching network includes the controller, the RF generator, and wherein the system comprises four matching networks, each of the four matching networks associated with a sub-controller.

12. The system of claim 4, wherein the matching network includes the controller, an RF power distributed coupling, and wherein the system comprises four matching networks, each of the four matching networks associated with a sub-controller.

13. The system of claim 4, wherein the matching network includes the controller, an RF power distributor, an RF current splitter and associated inductively coupled plasma (ICP) generators.

14. The system of claim 1, wherein the high density plasma source comprises a single RF generator and four transformers, the four transformers delivering equal portions of RF power into the input port of matching units of high density plasma source.

15. The system of claim 14, wherein a center section of a secondary winding from the matching network is removed or a capacitor from the matching unit is removed.

16. The system of claim 14, wherein a distributed RF power coupling unit uses an integrated multi-channel matching box and integrated antenna.

17. The system of claim 14, wherein four phase tuning circuits are integrated with a single load matching circuit and identical antennas.

18. The system of claim 4, wherein a plasma sweeping source is configured with a duty cycle using one, two, or three plasma sweeping sources in an overlapping or non-overlapping sequence or a rotational, bi-directional sequence or any combination of the aforementioned duty cycles.

19. A method of processing metal or metal nitride films in a plasma processing system which processes substrates, the method comprising:
    providing a substrate in a processing chamber;
    generating from a metal source a sputtered metal onto the substrate, wherein the metal source comprises a first conical target located above a second conical target, wherein the first and second conical targets generate a metal flux from a metal, and wherein an outer circumference of the first conical target is within an outer circumference of the second conical target;
    creating a high density plasma from a high density plasma source and applying the high density plasma in a sweeping operation without involving moving parts, and wherein the applying the high density plasma in a sweeping operation includes applying different power levels at different circumferential locations during processing of the substrate and changing the power levels circumferentially at the different circumferential locations during processing of the substrate; and controlling a plurality of operating variables in order to meet one or more plasma processing objectives.

20. The method of claim 19, wherein the one or more plasma processing objectives include improved ionization of a thermalized metal, uniform distribution of high density plasma, and/or capability of processing substrates having a size of 300 mm or larger.

21. The method of claim 19, wherein the sweeping operation of the high density plasma is azimuthal sweeping, linear sweeping, or bi-directional sweeping.

22. The method of claim 19, wherein the plurality of operating variables include power, frequency, and pulsing rate of the substrate bias source, pressure and inductance of high density plasma source, and distance to a sputtering target, sputtering rate, and cost of ownership of the metal source.

23. The method of claim 19, wherein the applying different power levels at different circumferential locations includes, during processing of the substrate, turning power ON at a first circumferential location at a first location ON time, and turning power ON at a second circumferential location adjacent to the first circumferential location at a second location ON time, wherein the first location ON time is prior to the second location ON time.

24. The method of claim 23, further including, during processing of the substrate, turning OFF power at the first circumferential location at a first location OFF time and turning power OFF at the second circumferential location at a second location OFF time, and wherein the first location OFF time is prior to the second location OFF time.

25. The method of claim 24, further including, during processing of the substrate, turning power ON and OFF at a third circumferential location and at a fourth circumferential location, and wherein the power ON and power OFF times of the third and fourth circumferential locations are respectively different from power ON and power OFF times of respective adjacent circumferential locations.

26. The method of claim 25, further including applying different DC voltages to the first and second conical targets.

27. The method of claim 19, wherein the applying different power levels and changing the power levels during processing of the substrate includes applying power and changing power at a first circumferential location according to a first power level sequence and applying power and changing power at a second circumferential location according to a second power level sequence, and wherein the first power level sequence and the second power level sequence are different such that a different power level is applied at the first circumferential location than at the second circumferential location both during the applying of the different power levels and after the changing of the power levels.

28. The system of claim 1, further including at least one DC power source coupled to the first conical target and the second conical target, and wherein the controller controls the at least one DC power source such that a different DC voltage is applied to the first conical target than to the second conical target.

* * * * *